US009967972B2

(12) United States Patent
Zluc et al.

(10) Patent No.: US 9,967,972 B2
(45) Date of Patent: May 8, 2018

(54) CIRCUIT BOARD HAVING AN ASYMMETRIC LAYER STRUCTURE (71) Applicant: AT & S Austria Technologie & Systemtechnik Aktiengesellschaft, Leoben (AT)

(72) Inventors: Andreas Zluc, Leoben (AT); Gerald Weidinger, Leoben (AT); Mario Schober, Trofaiach (AT); Hannes Stahr, St. Lorenzen im Mürztal (AT); Timo Schwarz, St. Michael i.O. (AT); Benjamin Gruber, Niklasdorf (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 0 days. days.

(21) Appl. No.: 15/534,897

(22) PCT Filed: Dec. 10, 2015

(86) PCT No.: PCT/EP2015/079200
§ 371 (c)(1),
(2) Date: Jun. 9, 2017

(87) PCT Pub. No.: WO2016/091992
PCT Pub. Date: Jun. 16, 2016

(65) Prior Publication Data
US 2017/0339784 A1    Nov. 23, 2017

(30) Foreign Application Priority Data
Dec. 11, 2014   (DE) .................. 10 2014 118 464

(51) Int. Cl.
*H05K 1/03*    (2006.01)
*H05K 1/00*    (2006.01)
(Continued)

(52) U.S. Cl.
CPC ......... *H05K 1/0271* (2013.01); *H01L 21/481* (2013.01); *H01L 21/4857* (2013.01);
(Continued)

(58) Field of Classification Search
CPC ... H05K 2201/0191; H05K 2201/0133; H05K 2201/068
(Continued)

(56) References Cited

U.S. PATENT DOCUMENTS 5,670,262 A * 9/1997 Dalman ................ C08G 73/18
361/750
7,719,104 B2   5/2010 Hsu et al.
(Continued)

FOREIGN PATENT DOCUMENTS

EP    1 650 253 A1    4/2006
EP    1 650 798 A2    4/2006
(Continued)

*Primary Examiner* — Sherman Ng
(74) *Attorney, Agent, or Firm* — Robert A. Blaha; Smith Tempel Blaha LLC (57) ABSTRACT A circuit board is described which includes a layer composite with at least one dielectric layer which includes a planar extension in parallel with respect to an xy-plane which is spanned by an x-axis and a y-axis perpendicular thereto, and which includes a layer thickness along a z-axis which is perpendicular with respect to the x-axis and to the y-axis; and at least one metallic layer which is attached to the dielectric layer in a planar manner. The layer composite along the z-axis is free from a symmetry plane which is oriented in parallel with respect to the xy-plane, and the dielectric layer includes a dielectric material which has an elastic modulus E in a range between 1 and 20 GPa and along the x-axis and along the y-axis a coefficient of thermal expansion in a range between 0 and 17 ppm/K. A method of manufacturing such a circuit board is also described. Further, a method of manufacturing a circuit board structure (Continued)

comprising two asymmetric circuit boards and a method of manufacturing two processed asymmetric circuit boards from a larger circuit board structure is described.

17 Claims, 5 Drawing Sheets (51) Int. Cl.

| | |
|---|---|
| *B32B 15/08* | (2006.01) |
| *H05K 1/02* | (2006.01) |
| *H05K 1/18* | (2006.01) |
| *H01L 23/538* | (2006.01) |
| *H01L 23/00* | (2006.01) |
| *H05K 3/46* | (2006.01) |
| *H05K 3/00* | (2006.01) |
| *H01L 21/48* | (2006.01) |
| *H01L 23/14* | (2006.01) |
| *H05K 1/11* | (2006.01) |

(52) U.S. Cl.
CPC ........ *H01L 23/145* (2013.01); *H01L 23/5383* (2013.01); *H01L 23/5387* (2013.01); *H01L 23/5389* (2013.01); *H01L 24/20* (2013.01); *H05K 1/0366* (2013.01); *H05K 1/0373* (2013.01); *H05K 1/0393* (2013.01); *H05K 1/115* (2013.01); *H05K 1/185* (2013.01); *H05K 1/189* (2013.01); *H05K 3/0017* (2013.01); *H05K 3/0097* (2013.01); *H05K 3/4602* (2013.01); *H05K 2201/0129* (2013.01); *H05K 2201/0133* (2013.01); *H05K 2201/0191* (2013.01); *H05K 2201/068* (2013.01); *H05K 2201/09136* (2013.01)

(58) Field of Classification Search
USPC .................................. 174/256, 258; 428/458
See application file for complete search history.

(56) References Cited

U.S. PATENT DOCUMENTS

| | | | |
|---|---|---|---|
| 7,768,119 | B2 | 8/2010 | Chia |
| 8,399,778 | B2 | 3/2013 | Hsu |
| 2002/0140095 | A1 | 10/2002 | Funakura et al. |
| 2005/0230848 | A1 | 10/2005 | Nakatani et al. |
| 2008/0057299 | A1 | 3/2008 | Adachi et al. |
| 2008/0217050 | A1* | 9/2008 | Egitto ................. H01L 21/4853 174/262 |
| 2010/0288549 | A1* | 11/2010 | Chiang ............... H01L 21/4857 174/261 |
| 2011/0259630 | A1 | 10/2011 | Park |
| 2013/0008024 | A1 | 1/2013 | Park |
| 2013/0026632 | A1 | 1/2013 | Kikuchi et al. |
| 2013/0307113 | A1 | 11/2013 | Kunimoto |

FOREIGN PATENT DOCUMENTS

| | | |
|---|---|---|
| EP | 2 042 655 A1 | 4/2009 |
| WO | WO2010085830 A1 | 8/2010 |

* cited by examiner

CIRCUIT BOARD HAVING AN ASYMMETRIC LAYER STRUCTURE

CROSS-REFERENCE TO RELATED APPLICATIONS

This application is a US national phase application of international patent application PCT/EP2015/079200 filed on Dec. 10, 2015, which claims the benefit of the filing date of German Patent Application No. 10 2014 118 464.5, filed on Dec. 11, 2014, the disclosures of which are hereby incorporated herein by reference in their entirety.

TECHNICAL FIELD

Embodiments of the present invention in generally relate to the technical field of component carriers and circuit boards, respectively, at and on which, respectively, electronic assemblies are built up. Embodiments of the present invention in particular relate to a circuit board which, despite of a very low thickness, comprises a high mechanical dimensional stability. Embodiments of the present invention further relates to a method of manufacturing such a circuit board.

TECHNOLOGICAL BACKGROUND

In modern electronics production, since many years there is the tendency to build up increasingly complex electronic assemblies within an increasingly smaller assembly space. This is denoted as tendency to miniaturization.

An electronic assembly which typically comprises a plurality of electronic components is built up in a known manner on a component carrier and a circuit board, respectively. Circuit boards may be rigid or flexible. For a complete miniaturization, also the circuit boards have to be small and, besides a low planar dimension, have to comprise also a low thickness.

A circuit board typically consists of a layer build-up made of multiple layers which contain at least one dielectric layer and metallic layers. Many circuit boards are realized as so-called multilayer-circuit boards which comprise a metallic layer not only at the top side and at the bottom side, but also comprise at least one further metallic layer in the center between two dielectric layers.

There may be a need to improve the structure and the manufacturing of circuit boards such that these, despite a low thickness, comprise a high mechanical dimensional stability.

SUMMARY

This need is met by the subject-matters of the independent claims. Advantageous embodiments of the present invention are described in the dependent claims.

According to a first aspect of the invention a circuit board is described which comprises a layer composite. The layer composite comprises (a) a dielectric layer which (a1) comprises a planar extension in parallel with respect to an xy-plane which is spanned by an x-axis and a y-axis perpendicular thereto, and (a2) comprises a layer thickness along a z-axis which is perpendicular to the x-axis and to the y-axis; and (b) at least one metallic layer which is attached to the dielectric layer in a planar manner. The layer composite along the z-axis is free from a symmetry plane which is oriented in parallel with respect to the xy-plane. The dielectric layer comprises a dielectric material which has (i) an elastic modulus E in a range between 1 and 20 GPa and (ii) along the x-axis and along the y-axis a coefficient of thermal expansion in a range between 0 and 17 ppm/K.

The present circuit board is based on the idea that due to the mechanical properties of the dielectric material, circuit boards with an asymmetric layer build-up comprise a high mechanical dimensional stability, also when temperature fluctuations are present, when the asymmetric layer build-up comprises only a low layer thickness. Thereby, with the same mechanical dimensional stability compared to known circuit boards which typically are built up with the flame retardant material FR4, significantly thinner circuit boards can be built up and thus a valuable contribution for the further miniaturization of electronic assemblies can be made.

The described dielectric material, compared to the known material FR4, is relatively soft and compliable. Due to this property, only low thermally induced mechanical stresses occur, such that warpages of a layer of the described asymmetric circuit board can be reliably avoided.

The metallic layer may be attached to the dielectric layer immediately, i.e. directly, or mediately, i.e. indirectly above one or more intermediate layers.

It should be noted that the above described surprisingly high dimensional stability, in particular during temperature fluctuations, has been experimentally proven by means of so-called reflow-tests by the inventors. In such reflow-tests, the circuit board, starting from room temperature, is subjected to such high temperatures which typically occur in a reflow oven and which are sufficient for melting a solder paste which is located between component-terminal contacts of assembled components and terminal pads on the surface of a circuit board, and for soldering the concerned components to the upper surface of the circuit board. Inventive circuit boards have at least withstood ten reflow-cycles without destruction, wherein a reflow-cycle includes a temperature change from room temperature to a certain reflow-temperature and back.

The inventive dielectric material comprises a coefficient of thermal expansion in a range between zero and 17 ppm/K. In this context it should be noted that from a technical point of view it is not a problem to manufacture a material with a coefficient of thermal expansion of zero. It is namely commonly known that materials, in particular plastic materials, with a negative coefficient of thermal expansion exist. In order to manufacture a material with a coefficient of thermal expansion of zero, it is only required to mix a material with a negative coefficient of thermal expansion and a material with a positive coefficient of thermal expansion in a suitable manner, such that the positive and the negative expansion compensate each other at least approximately. Subsequently, the term coefficient of thermal expansion is also denoted as CTE (coefficient of thermal expansion).

With respect to the range of values of the elastic modulus E from 1 GPa to 20 GPa, the inventors have arrived at the knowledge that the lower limit of 1 GPa results therefrom that the dielectric material must not be too soft for a process reliable processing and in particular for a procedure of pressing together or pressing the different layers of the circuit board. When exceeding the upper limit of 20 GPa, no sufficient creeping behavior results for such a proceeding of pressing.

It should be noted that the values for the elastic modulus E which are mentioned in this document relate to a temperature of 25° C. It has turned out by means of experimental examinations that the dielectric layer, also when strong temperature fluctuations are present, shows no or only very little warpages of less than 1%. Thus, the described circuit board can be further processed without problems, wherein a further processing may in particular consist in that the circuit board is assembled with further electronic components and/or is soldered in a reflow-oven. The described circuit board can also be connected, for example adhered, to a further circuit board, such that a circuit board with multiple layers results. In this context, a warpage of less than 1% means that a warpage height of the concerned layer (along the z-axis) in relation to a length of the concerned layer (in an xy-plane which is perpendicular with respect to the z-axis) is less than 1%.

The inventive circuit board can be used for so-called power modules in an especially advantageous manner, which operate with and at a large electrical power, respectively, and in which naturally a high heat development occurs due to electrical losses which can never be avoided. In manufacturing of such power modules, typically multiple circuit boards which are assembled with high power components are connected to each other in a suitable manner, such that these are arranged within a relatively small assembly space and hence a very strong heat development occurs, in particular in an interior of this assembly space. As a result, the inventive circuit board which comprises an especially high thermal stability is especially suitable for such applications.

It should be noted that the described ranges of values of the inventive dielectric material constitute a currently ideal combination of elastic modulus and CTE. On the one hand, the thermal expansion is namely so small that only very low thermal tensions occur and on the other hand the stiffness of the dielectric material is (a) so low that possibly present small thermal expansions can be compensated, and (b) so large that the dielectric material can be further processed in a conventional manner.

According to an embodiment of the invention the circuit board which is described in this document is formed by a material which is described in EP 2 666 806 A1. This material is manufactured from a fiber substrate and a layer made of a resin composition which is curable by heat. This layer contains a modified siloxane compound or a compound with a basic structure made of a modified siloxane compound.

The described metallic layer may in particular be a copper layer which results from a copper foil. When manufacturing the described circuit board made of a layer composite which is consisting at least of the dielectric layer and the described metallic layer, the copper foil in the most simple case can be lied over the corresponding dielectric layer and can be pressed together with the dielectric layer to a composite later. For the described circuit board, of course also layer build-ups are possible which comprise more than one metallic layer and/or more than one dielectric layer.

The term "free from a symmetry plane" may in particular denote that along the z-direction no plane is present which constitutes a symmetry plane for the entirety of the layer composite. However, it is possible that with respect to only a part and a substructure, respectively, of the layer composite (along the z-axis) a symmetry plane exists. However, the described circuit board preferably does not comprise a symmetry plane for an arbitrary part of the circuit board as well.

In this document, the term "layer composite" in particular denotes a sequence of layers which respectively are characterized by a certain thickness and by a certain material. The layer composite may comprise an arbitrary sequence of electrically conductive layers, electrically insulating (dielectric) layers, layers with a predetermined thermal conductivity and/or adhesive layers. Dielectric layers (except of one layer) may comprise the dielectric material which is described herein or any other known dielectric material.

According to an embodiment of the invention the dielectric material comprises a creeping property which is determined by at least one of the following features: (a) a plastic deformability in a range between 0.01% and 10%, in particular in a range between 0.1% and 5% and further in particular in a range between 0.2% and 2%, and/or (b) a viscoelastic deformability in a range between 0% and 10%, in particular in a range between 0% and 5% and further in particular in a range between 0% and 3%.

In this document, the term "deformability" may in particular denote the capability of the dielectric material to change its dimension (along a spatial direction) without a destruction of the inner structure (for example by forming hollows). Therefore, the mentioned parameter values relate to a change in length (in particular under tensile stress) of a stripe of material. It is assumed that during such a length change, the volume of the concerned stripe of material remains at least approximately the same. Descriptively speaking, when the stripe of material is expanded along its longitudinal direction, the stripe of material (perpendicular with respect to its longitudinal direction) becomes thinner.

It should be noted that the parameter values for the plastic deformability and the viscoelastic deformability which are specified here relate to room temperature (20° C.).

It should further be noted that the creeping property of the described dielectric material is at least approximately isotropic. This means that the creeping behavior of the dielectric layer is at least approximately equal in all spatial directions.

The described creeping property of the dielectric material has the advantage that during manufacturing the circuit board and in particular during pressing the different circuit board layers, the dielectric material extends into possibly present hollows and remains therein.

Thereby, the mechanical dimensional stability during temperature fluctuations, which is also referred to as thermal dimensional stability in this document, is further improved.

The creeping property which is described here has the effect that during curing the dielectric material, the dielectric material still comprises a certain slidability for a certain time. Thus, a certain relaxation time results in which the material remains elastically deformable, but in particular also plastically deformable. Within this relaxation time and creeping time in particular the procedure of pressing the different layers of the inventive circuit board should be at least approximately completely performed.

The above described value ranges for the elastic modulus and the CTE in connection with the creeping property which is described here constitute an ideal combination for a secure and gentle embedding of the electronic component. The creeping property which is described here namely has the effect that during a curing of the material, the material still comprises a certain slidability for a certain time. Thus, a certain relaxation time results in which the material remains elastically deformable, but in particular also plastically deformable. Within this relaxation time and creeping time, in particular the procedure of pressing the different layers of the inventive circuit board should be at least approximately completely performed.

Furthermore, the described dielectric material can distinguish itself by remaining plastically deformable despite of a high elastic portion.

According to a further embodiment of the invention the dielectric material is a blend or a copolymer, consisting of at least one first material with a first elastic modulus E and a first coefficient of thermal expansion and a second material with a second elastic modulus E and a second coefficient of thermal expansion. The first elastic modulus is larger than the second elastic modulus and the first coefficient of thermal expansion is smaller than the second coefficient of thermal expansion.

Descriptively speaking, the first material compared to the second material is harder and comprises a smaller CTE. By choosing a suitable blending ratio or copolymerization ratio between the first material and the second material, the above described dielectric material which comprises the desired elastic modulus E and the desired CTE can be manufactured in a relatively easy manner.

According to a further embodiment of the invention the first material comprises a first glass transition temperature and the second material comprises a second glass transition temperature.

By the selection of two materials with different glass transition temperature (Tg), the above described dielectric material which comprises the desired elastic modulus E and the desired CTE can be manufactured in an especially easy manner by mixing or copolymerization of the both materials.

The first Tg may be in a range between 150° C. and 190° C. and in particular in a range between 160° C. and 180° C., for example. Preferably, the first Tg is at least approximately 170° C. The second Tg may be in a range between 0° C. and 70° C. and in particular in a range between 10° C. and 30° C., for example. Preferably, the first Tg is at least approximately at room temperature (20° C.).

According to a further embodiment of the invention the first material comprises a resin and a hard filler which is located therein.

The resin may be a phenol resin or an epoxy resin, such as a brominated bisphenol A epoxy resin, for example. The filler may be glass, quartz and/or aluminum hydroxide. With such a filler, a low value for the CTE of the first material can be adjusted in an especially easy manner. Preferably, the filler may comprise small SiO2 spheres or particles which are surrounded by the resin.

According to a further embodiment of the invention the second material comprises a thermally curable resin which is connected to a softening substance. This may have the advantage that by means of a suitable dosage of the softening substance, the desired hardness and softness, respectively, of the dielectric material can be adjusted in a simple and accurate manner.

The softening substance may be an aliphatic polyester or polyether, for example, wherein during polyaddition, an elastic block copolymer is generated.

According to a further embodiment of the invention the value for the elastic modulus E is in a range between 2 and 7 GPa and in particular in a range between 3 and 5 GPa.

With an elastic modulus in these ranges, an especially good compromise between (a) an embedding of the electronic component, which is as tension-free as possible, and (b) a good processability of the dielectric layer can be achieved.

According to a further embodiment of the invention the coefficient of thermal expansion is in a range between 3 and 10 ppm/K and in particular in a range between 5 and 8 ppm/K.

According to an embodiment which is currently considered as the best, the CTE of the dielectric material is at least approximately 6 ppm/K. Thereby, the CTE of the dielectric material is approximately the same as the CTE of electronic components which consequently can be attached to the circuit board or can be embedded in the circuit board especially tension-free. In this context it should be noted that the CTE of electronic components is substantially determined by the CTE of silicon which comprises a CTE value of approximately 3 ppm/K.

According to a further embodiment of the invention the layer composite comprises an asymmetry with respect to the number of the layers along the z-axis.

An asymmetry with respect to the number of the layers of the layer composite may in particular mean that above a plane which is perpendicular with respect to the z-axis, a first number of layers is present and below this plane, a second number of layers is present. This plane may be a center plane with respect to the entire thickness of the layer composite.

According to a further embodiment of the invention the layer composite comprises an asymmetry with respect to the thicknesses of the single layers along the z-axis.

An asymmetry with respect to the thicknesses of the layers of the layer composite may in particular mean that at least one layer thickness above a plane which is perpendicular with respect to the z-axis comprises a different thickness than a corresponding layer at the lower side of this plane. The "correspondence" of the both layers may in particular consist in that they comprise the same material. The number of the layers above this plane may be the same as or different than the number of the layers below this plane.

According to a further embodiment of the invention the layer composite comprises an asymmetry with respect to the materials of the single layers along the z-axis.

An asymmetry with respect to the materials may in particular mean that above a plane which is perpendicular with respect to the z-axis, other materials or material combinations for the respective layers are used.

With respect to the layer thicknesses and/or the number of the layers, this plane could even be a symmetry plane in very special embodiments.

It should be noted that also an arbitrary combination of the asymmetries mentioned above can be given.

According to a further embodiment of the invention the circuit board further comprises a component and in particular an electronic component, which is embedded in the dielectric layer and/or in a dielectric core-layer of the circuit board.

The above described dimensional stable dielectric material of the inventive circuit board may not only be used for forming an asymmetric layer composite. Rather, according to the embodiment described here, also a component is embedded in this material which, also when comparably strong temperature fluctuations occur, generates no or only less mechanical stress. With respect to the circuit board and a circuit board use, respectively, a component may be embedded, or two or more than two components may be embedded.

Due to the low thermally induced internal mechanical stresses, in the case of an electronic component, also the (internal) terminals of the embedded component are exposed to only a low mechanical stress. Furthermore, also the surfaces of the embedded electronic component, which are in contact with the dielectric prepreg material, are only little mechanically loaded by temperature fluctuations, such that the electronic component is embedded in the circuit board in a mechanically gentle manner.

Due to the possibility to embed an electronic component in at least one of the both dielectric layers with low stress, the inventive circuit board can also be equipped with comparably large electronic components which have an area of 10 mm×10 mm, for example. Moreover, the low thermally induced mechanical loads also lead to a reduction of the mechanical stress on the electrical connections to and/or from the electronic component, when the inventive circuit board, in the course of a further electronics production, is connected to other conventional circuit boards, for example to a multilayer circuit board.

In this document, the term "embedded" may denote that the component is surrounded from multiple sides by the concerned material and the concerned layer, respectively. The concerned side of the component may be covered completely or only partially by the concerned material and the concerned layer, respectively. An embedded state of the component, in the case of a cuboid-shaped geometry of the component (i.e. a component with 6 side-surfaces in total), may be present in particular (a) when the lower side surface and the four side surfaces are covered by a the embedding material, (b) when only the four side surfaces are covered by the embedding material, (c) when the lower side surface is entirely covered and the four side surfaces are only partially covered by the embedding material, or (d) when only the four side surfaces are only partially covered by the embedding material.

As already mentioned above, the component may be an electronic component which in turn may be each arbitrary active or passive electronic component. In this context, the electronic component may be a further circuit board, a module (a circuit board which is entirely or partially assembled with components), a battery and/or a MEMS structure. However, the component may also be a "non-electronic" component, for example a cooling element, which in particular is consisting of a metallic material.

According to a further embodiment of the invention the component is embedded in the dielectric layer.

If the described circuit board additionally comprises the above described dielectric core-layer, the component preferably is located exclusively in the dielectric layer.

It should be noted that using the above-described dielectric core-layer for the circuit board described in this document is optionally. Also when the dielectric core-layer confers a certain mechanic strength to the circuit board, which is advantageously in many applications, the inventive circuit board may also be built up without dielectric core-layer, in particular in the case when it shall be a flexible circuit board.

According to a further embodiment of the invention the circuit board further comprises the dielectric core-layer which is attached to the metallic layer and/or to the dielectric layer in a planar manner. The component is embedded in the dielectric core-layer and the dielectric layer is arranged above or below the dielectric core-layer and the embedded component.

Preferably, the component is exclusively embedded in the dielectric core-layer. Moreover, the dielectric core-layer may be arranged between two dielectric layers. More preferably, the dielectric layer is located directly on the dielectric core-layer and the component, respectively.

Descriptively speaking, the dielectric layer constitutes a cover structure for the component. Thereby, the dielectric layer which to a high degree is responsible for the absence of tension in the described circuit board is located directly at the component whose embedding is thereby at least approximately perfectly tension-free.

In this context, currently in particular layer build-ups seem to be interesting which result by a combination of a relatively stiff dielectric core-layer which comprises a low shrinkage with the dielectric layer described in this document. Here, besides the embedding of the component with low stress, namely also a good dimensional stability may be ensured which is important in particular for a further build-up to a high quality multilayer-circuit board.

The here described stiffness of the dielectric core-layer may be achieved, for example, by using a curable material for the dielectric core-layer, which is cured in the course of manufacturing the described circuit board.

According to a further embodiment of the invention the component is adhered within the dielectric core-layer. This enables an especially stable embedding of the component in the dielectric core-layer in an advantageous manner.

Preferably, in this embodiment, the dielectric core-layer is a stiff core which is equipped with a dielectric layer on both planar sides. Attaching the both dielectric layers may be performed in a known manner by means of laminating, in order to generate a stable layer composite with the embedded electronic component.

According to a further embodiment of the invention the dielectric core-layer comprises a dielectric core-material which has a coefficient of thermal expansion from 0 to 11 ppm/K, in particular from 2 to 10 ppm/K and more preferably from 3 to 9 ppm/K, along the x-axis and along the y-axis.

This has the advantage that the core of the circuit board is consisting of a material which comprises a CTE in the order of magnitude of the CTE of the embedded component and Si, respectively. The core-material may, in particular in the case when it is a curable core-material, have a high elastic modulus E, in order to be able to absorb forces which are generated during the procedure of laminating and thus to not transfer the forces to the embedded component. The dielectric material described above with its comparably low elastic modulus E may be located in a gap between the embedded component and the core-material. Due to the low elastic modulus E, it is able to compensate tensions in an advantageous manner.

In this context it should be noted that by the thermal adapting of the coefficients of thermal expansion of the dielectric core-material and the electronic component, the following advantageous effects can be achieved:

(A) the operational reliability of an electronic circuit which is built up on the circuit board, which may optionally contain the embedded electronic component can be improved compared to known circuit board-build-ups, in particular during fluctuating thermal conditions.

(B) also in subsequent thermal processes, no or only negligible mechanical tensions are introduced in the layer composite of the described circuit board. Thereby, a composite with no warpage results. This applies even when a surface ratio of the embedded component(s) compared to the entire surface of the described circuit board is more than 30%.

According to a further embodiment of the invention the entire thickness of the layer composite is less than approximately 200 µm, in particular smaller than approximately 190 µm and further in particular smaller than approximately 180 µm. In embodiments which have been already realized by the inventors, the layer composite even has an entire thickness of only 170 µm and of 150 µm, respectively, and is therefore thinner than approximately 175 µm.

It should be noted that the achieved minimum thicknesses of the circuit board are dependent on the height of the embedded component. In this context, the thicknesses mentioned above relate to an embedded component with a height of 150 μm.

It should further be noted that the thickness of the layer composite may be equal to the thickness of the entire circuit board. With the here described combination of the dielectric material and the asymmetric build-up, when an embedded component with a thickness of 150 micrometer is present, stable circuit boards and circuit board structures, respectively, can consequently be built up which are up to 20% thinner than conventional circuit boards with such an embedded component.

The circuit board may comprise a mechanical supporting structure exclusively on one side, that is either above or below the embedded electronic component. It should be noted that such a structure is only possible when using the dielectric layer described in this document, since only this dielectric layer comprises the elasticity and the thermal expansion which are required for such a build-up.

According to a further embodiment of the invention the dielectric layer is a dielectric prepreg-layer or the dielectric material is a dielectric prepreg-material.

In this document, the term "prepreg-layer" may denote a pre-manufactured dielectric layer-shaped substrate which is formed by a "prepreg-material". In this context, prepreg is the English short form for "pre-impregnated fibers" which means "vorimprengnierte Fasern" in German. A prepreg is a semi-finished product consisting of long fibers or endless fibers and a pre-dried and pre-cured, respectively, but not yet polymerized thermosetting plastic matrix which is particularly also used in lightweight construction. The contained fibers may be present as purely unidirectional layer, as tissue or as fabrics (Gelege).

According to a further aspect of the invention a method is specified for manufacturing a circuit board and in particular a circuit board described above. The method comprises building up a superordinated layer composite with (a) at least one dielectric layer which (a1) comprises a planar extension in parallel with respect to an xy-plane which is spanned by an x-axis and a y-axis which is perpendicular thereto, and (a2) comprises a layer thickness along a z-axis which is perpendicular with respect to the x-axis and to the y-axis; and (b) at least one metallic layer which is attached to the dielectric layer in a planar manner. The layer composite is free from a symmetry plane which is oriented in parallel with respect to the xy-plane and the dielectric layer comprises a dielectric material. The dielectric material has (i) an elastic modulus E in a range between 1 and 20 GPa and (ii) along the x-axis and along the y-axis a coefficient of thermal expansion in a range between 0 and 17 ppm/K.

Also the described method is based on the idea that by means of the special properties of the mentioned dielectric material, circuit boards with an asymmetric layer build-up can be realized which, during larger temperature fluctuations, comprise a high mechanical dimensional stability, also when the asymmetric layer build-up comprises only a low layer thickness.

According to an embodiment of the invention the method further comprises (a) forming a recess in the dielectric layer and/or in a dielectric core-layer; and (b) inserting an electronic component into the recess.

Furthermore, an adhesive material can be inserted in the recess. This may be a glue with a low viscosity which has the property to establish a connection which is as tight as possible both (a) with the material of the electronic component and (b) with the dielectric layer and/or with the dielectric core-layer. Thereby, an especially high mechanical stability of the embedding of the electronic component can be achieved.

In dependency from the package of the electronic component, the adhesive should be configured such that it has a good connection to a semiconductor material, in particular silicon (if the electronic component is an un-housed chip and a bare die, respectively), or to a typical packaging material of the component (if the electronic component is a housed chip).

According to a further embodiment of the invention the recess is larger than the electronic component, such that after an inserting of the electronic component in the recess, a hollow remains.

The dielectric material can enter into this hollow in the course of further processing the circuit board, such that the embedded electronic component is surrounded by the dielectric material from different sides. Thereby, an especially stress-free embedding of the electronic component in the circuit board results in an advantageous manner.

According to a further embodiment of the invention the method further comprises (a) if the electronic component is inserted in the dielectric layer, applying a further dielectric layer on the dielectric layer and the electronic component, wherein the further dielectric layer has the same properties as the dielectric layer; and (c) if the electronic component is embedded in the dielectric core-layer, applying the dielectric layer on the dielectric core-layer and the electronic component.

Descriptively speaking, according to the embodiment described here, the applied further dielectric layer and the applied dielectric layer, respectively, constitutes a cover structure which serves for a good mechanical stability while the electronic component furthermore is embedded in a stress-free manner. This applies in particular also when temperature fluctuations are present which may occur during a further manufacturing of an electronic assembly on the described circuit board and/or during an operation of the electronic assembly which is built up on the described circuit board.

According to a further embodiment of the invention the method further comprises forming a metallic layer at the dielectric layer.

The metallic layer in particular may be a copper layer which can be structured later in a suitable manner in order to provide conductor traces for (with respect to the circuit board external) electronic components of an electronic assembly which is assembled on the circuit board. Furthermore, such conductor traces can also be used for contacting the embedded (with respect to the circuit board internal) electronic component. For this purpose, vias can be used in a known manner which in particular can be formed in the dielectric layer which is covering the electronic component, for example by means of laser drilling, and which can be subsequently metallized in a known manner in order to realize a contacting perpendicular with respect to the plane of the layers of the circuit board.

According to a further embodiment of the invention the method further comprises pressing all layers of the circuit board.

By means of a suitable pressing, from the previously comparably loose layer build-up of the circuit board, a mechanically stable asymmetric layer composite can be generated in an easy manner. However, it should be noted that in particular in dependency from the entire thickness of the layer composite, the circuit board can still comprise a certain (desired) flexibility.

According to a further embodiment of the invention a method of manufacturing a circuit board structure is described. The described method comprises (a) manufacturing a first circuit board by a method of the above described type; (b) manufacturing a second circuit board by a method of the above described type; and (c) assembling the first circuit board and the second circuit board, such that the resulting circuit board structure comprises at least a thickness which results from the sum of a first thickness of the first circuit board and a second thickness of the second circuit board.

The described method is based on the idea that the first circuit board and/or the second circuit board can also be a semi-finished product for manufacturing the described (larger) circuit board structure.

The resulting circuit board structure in particular may comprise an asymmetric entire layer sequence which, due to the above described excellent mechanical properties of the dielectric layer, despite the asymmetric build-up comprises a high dimensional stability also during larger temperature fluctuations.

According to a further embodiment of the invention the resulting circuit board structure comprises a symmetric entire layer sequence. This may have the advantage that the dimensional stability of the symmetric circuit board structure, in particular during strong temperature fluctuations, is further improved compared to the dimensional stability of the both asymmetric circuit boards.

According to a further embodiment of the invention a method of manufacturing two processed circuit boards is described. The method comprises (a) building up a layer composite with a first (asymmetric) circuit board of the above described type, a second (asymmetric) circuit board of the above described type and a release layer which is arranged between the first circuit board and the second circuit board; (b) processing the entire layer composite; and (c) separating the layer composite at the release layer, such that a first processed circuit board and a second processed circuit board with respectively an asymmetric layer build-up are generated.

The described method is based on the idea that a symmetrically built layer composite with all its advantages can be used during manufacturing and processing thereof, in order to manufacture two asymmetric circuit boards by means of a suitable separating at a release layer, which comprise the above-described advantages, in particular the especially low entire thickness.

In the here described method, the two at least partially unprocessed circuit boards which are built up to the layer composite, constitute a semi-finished product. The connection of these both semi-finished products which respectively comprise at least one of the dielectric layers described above, is preferably performed at selected positions by means of pressing. The selected positions in particular may be given by points which are not required in the further process execution anymore and which are not influenced by the further process execution anymore, respectively.

After pressing, in an advantageous manner both semi-finished products can be treated simultaneously, wherein there is no need to waive the advantages of an asymmetric build-up. This treatment and processing, respectively, may contain all the necessary working steps in circuit board production. The working steps may, for example, contain a further building up of layers, a drilling of vias, a photo etching, etc. By releasing the processed first circuit board from the processed second circuit board at the release layer, two asymmetric circuit boards are obtained in an easy manner which have been manufactured in a single process run. Subsequently, at the both single processed asymmetric circuit boards, final finishing-processes such as depositing of gold layers, contour milling, etc. may be performed.

According to an embodiment of the invention the built-up layer composite comprises a symmetry plane along the z-axis, which is oriented in parallel with respect to the xy-plane.

According to a further embodiment of the invention the release layer comprises a printable adhesion reducing material which is transferred by means of a printing method and in particular by means of a screen printing method on at least a subregion of the first circuit board or on at least a subregion of the second circuit board. Such an adhesion reducing material which is also referred to as adhesion prevention material is described in WO 2010/085830 A1, for example, and is composed of an adhesion prevention additive, a binding agent, and a solvent. Such an adhesion prevention agent may, previously to laminating and pressing the concerned layer composite, respectively, be structured and printed on the desired surface of the concerned circuit board and allows, after laminating and separating the lateral boundary of the structured region, a separating of the both (parts of the) circuit boards in the structured region. Such an approach for separating can be performed distinctly easier and cheaper than for example another approach wherein, instead of the adhesion reducing material, a separating foil (e.g. a Teflon foil) is arranged between the both circuit boards previously to the procedure of laminating and pressing, respectively.

It should be noted that embodiments of the invention are described with reference to different subject-matters of the invention. In particular, some embodiments of the invention are described with apparatus claims and other embodiments of the invention are described with method claims. When reading this application, it becomes immediately apparent to those skilled in the art that, unless explicitly otherwise specified, in addition to a combination of features which belong to a type of subject-matter of the invention, also an arbitrary combination of features is possible which belong to different types of subject-matters of the invention.

Further advantages and features of the embodiments of the present invention can be taken from the following exemplary description of currently preferred embodiments. The single figures of the drawing of this application are to be considered as merely schematically and not as true to scale.

DETAILED DESCRIPTION OF EXEMPLARY EMBODIMENTS

It should be noted that in the following detailed description, features and components, respectively, of different embodiments which are equal or at least functionally equal to the respective features and components, respectively, of another embodiment, are provided with the same reference signs or with a reference sign which only differs in the first digit from the reference sign of the equal or at least functionally equal features and components, respectively. In order to avoid unnecessary repetitions, features and components, respectively, which have been already described by means of a previously described embodiment, shall not be described in detail later.

Further, it should be noted that the subsequently described embodiments merely constitute a restricted selection of possible variants of the embodiments of the invention. In particular, it is possible to combine the features of the single embodiments in a suitable manner, such that with the variants of the embodiments which are explicitly shown here, a multiplicity of different embodiments are to be considered as obviously disclosed for those skilled in the art.

Moreover, it should be noted that spatially related terms, such as "front" and "back", "above" and "below", "left" and "right", etc. are used to describe the relationship of an element to another element or to other elements, as illustrated in the figures. Accordingly, the spatially related terms may apply for orientations which differ from the orientations which are shown in the figures. However, it is self-evident that all such spatially related terms, for the sake of simplicity of the description, relate to the orientations which are shown in the figures and are not necessarily limiting, since the respectively shown device, component etc., when in use, can assume orientations which differ from the orientations which are shown in the drawing.

Figure 1:
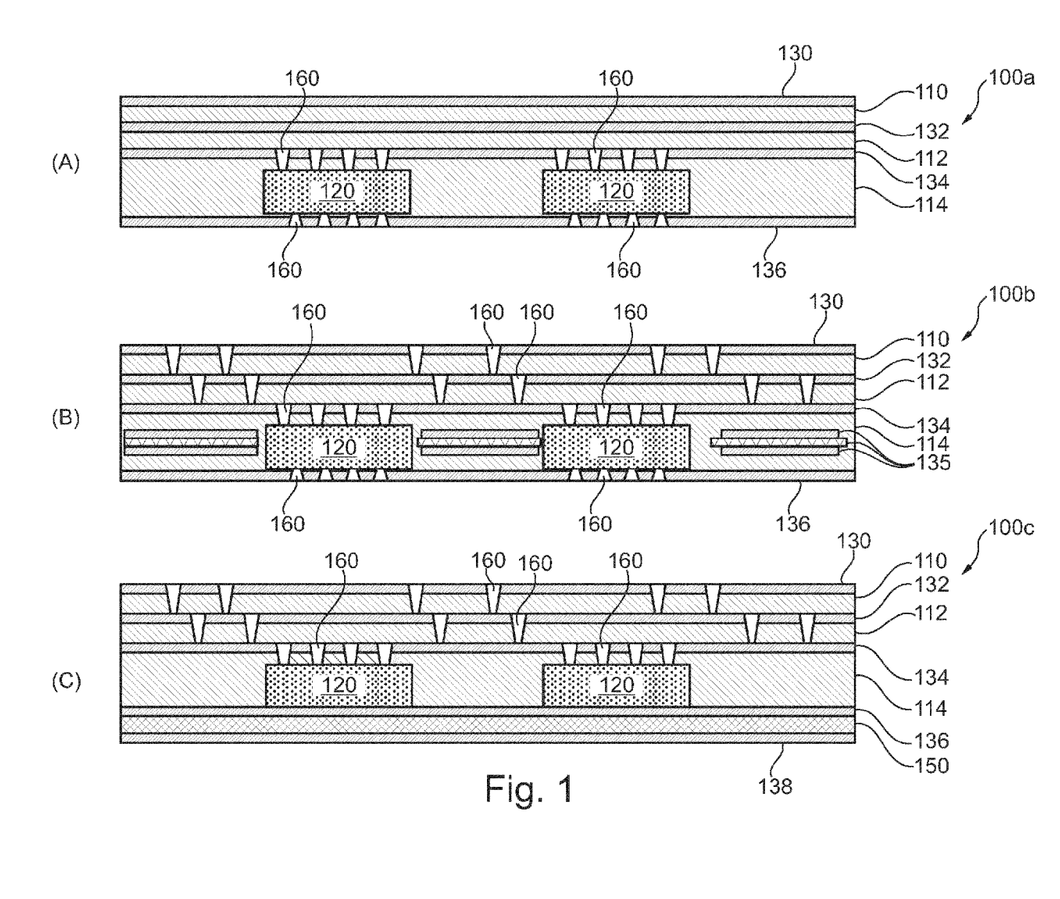
FIGS. 1A, 1B and 1C show different asymmetric circuit boards which respectively comprise an embedded electronic component.

The FIGS. 1A, 1B and 1C show different asymmetric circuit boards 100a, 100b and 100c which respectively comprise an embedded electronic component 120.

The circuit board 100a comprises a layer sequence which comprises respectively alternating along a vertical z-axis a metallic layer 130, a dielectric layer 110, a metallic layer 132, a dielectric layer 112, a metallic layer 134, a dielectric layer 114 and a metallic layer 136. According to the here described embodiment, the metallic layers 130, 132, 134 and 136 are, at least previously to pressing the layer sequence, metal foils which comprise the material copper or consist of copper in a known manner.

According to the here described embodiment, all dielectric partial layers 110, 112 and 114 have the properties with respect to the elasticity (the elastic modulus E is in a range between 1 and 20 GPa) and the thermal expansion (the coefficient of thermal expansion CTE is in a range between 0 and 17 ppm/K) which have been described above in this document.

As can be seen in FIG. 1A, the dielectric layer 114 comprises a larger layer thickness compared to the other dielectric layers 110 and 112. Furthermore, in the dielectric layer 114 two electronic components 120 are embedded. Although according to the here described embodiment, the electronic components 120 are not arranged centered in the dielectric layer 114, however, as can be seen in FIG. 1A, they are entirely surrounded by the corresponding dielectric material. Due to the above explained mechanical and thermal properties of the dielectric material, the electronic components 120 which may be active components, passive components and in particular an RFID component, are embedded in the circuit board 100a in an especially gentle manner.

It should be noted that the circuit board 100a after manufacturing thereof, in particular by means of pressing, can also be separated and singularized, respectively, into multiple single circuit boards, such that in each single circuit board only one single electronic component 120 is embedded, for example.

It should further be noted that the electronic components 120 may be so-called bare dies and unhoused chips, respectively. Alternatively, the electronic components 120 may also be housed electronic components which comprise metallic contact structures and contact pads, respectively, which are not shown in FIG. 1A, on at least one of their outer surfaces.

For electrically contacting the electronic components 120, according to the here described embodiment, vias 160 are used in a known manner. These may be formed by means of laser drilling, for example. According to the here described embodiment, these vias 160 extend both from above and also from below up to the both electronic components 120. By a metallization of these vias 160, the electronic components 120 may be electrically contacted later in a suitable manner by the both metallic layers 134 and 136 and, where applicable, by further metallic layers (by further vias which are not shown).

It should be noted that vias can also be implemented in other plies of the circuit board 100a. For example, (further) vias may be implemented from the dielectric layer 110 up to the metallic layer 134 and/or between the both metallic layers 132 and 134.

The circuit board 100b which is shown in FIG. 1B, compared to the circuit board 100a, additional comprises a structured core 135 which comprises two structured metallic plies and one structured dielectric layer which is located between the both metallic plies. As can be seen in FIG. 1B, the core 135 is structured and arranged with respect to the entire circuit board 100b, such that it is embedded apart from the electronic components 120 in the (thick) dielectric layer 114.

A further difference between the circuit board 100b and the circuit board 100a consists in that not only the electronic components 120, but also the metallic layers 130 and 132 are contacted by means of vias 160. It should be noted that the vias 160 which are formed in the dielectric layers 110 and 112 may also be present in the circuit board 100a, but cannot be taken from the sectional view of FIG. 1A. In this context, it should be noted that vias in principle may be implemented in all plies of the circuit board 100b.

A further difference between the circuit board 100b and the circuit board 100a consists in that the circuit board 100b is not a layer build-up which uses the same dielectric material which is above described in detail for all dielectric layers. Rather, for the circuit board 100b, a mixture of this dielectric material and (for the core) a material with an especially small CTE was used.

The circuit board 100c which is shown in FIG. 1C, compared to the circuit board 100a, additionally comprises a sandwich structure as a structured core, at which the both electronic components 120 are attached. This sandwich structure contains, according to the embodiment shown here, a dielectric core-layer 150 which is located between the metallic layer 136 and a further metallic layer 138. Compared to using only the metallic layer 136 as it is shown in the FIGS. 1A and 1B, the sandwich structure (reference signs 136, 150 and 138) constitutes a distinctly more stable carrier structure for the both electronic components 120.

The dielectric core-layer 150 comprises a dielectric core-material which, according to the embodiment which is shown here, has a coefficient of thermal expansion in a range from 6 to 9 ppm/K along the x-axis and along the y-axis. In this context, it should be noted that the x-axis and the y-axis span an xy-plane which is oriented perpendicular with respect to the vertical z-axis. This means that the planar surfaces of the single layers of the circuit boards 100a, 100b and 100c are oriented in parallel with respect to this xy-plane.

It should be noted that at least one of the above described dielectric layers may also be a dielectric prepreg-layer which has the special mechanical and thermal properties which are described in this document and which constitutes a material composite made of glass fibers and resin. The same also applies for the subsequently described embodiments.

Figure 2:
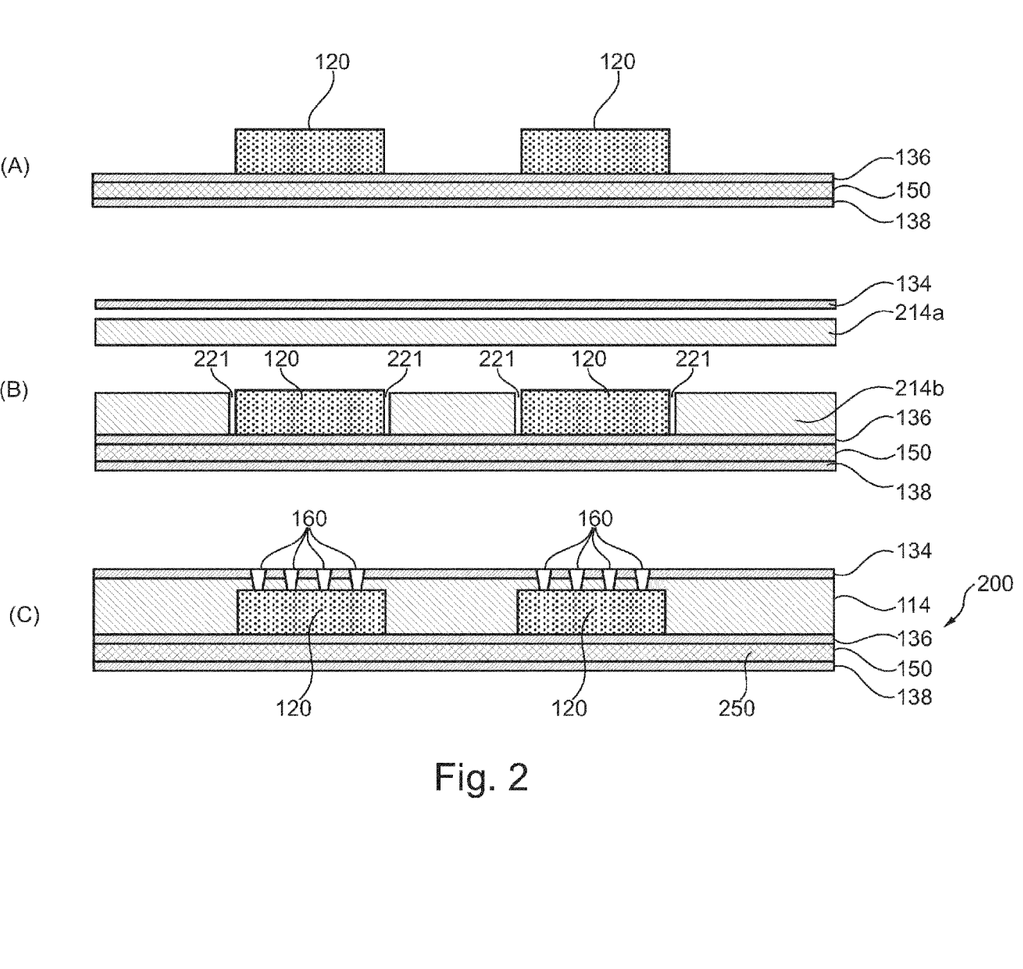
FIGS. 2A, 2B and 2C show in a cross-sectional view the manufacturing of a circuit board with two embedded electronic components which, at the beginning of manufacturing, are attached on a sandwich structure which comprises a dielectric core-layer between two metallic layers.

The FIGS. 2A to 2C show in a cross-sectional view the manufacturing of a circuit board 200 which comprises two embedded electronic components 120. The both electronic components 120, as can be seen in FIG. 2A, firstly are applied on the sandwich structure which is known from FIG. 1C, which contains a dielectric core-layer 250 which is located between the both metallic layers and metal foils, respectively, 136 and 138. As already mentioned above, compared to using only one metal foil 136, the sandwich structure (reference signs 136, 150, 138) constitutes a distinctly more stable carrier structure for the both electronic components 120. This facilitates in an advantageous manner the handling of the carrier structure for the both electronic components. The circuit board 200 corresponds to the lower part of the circuit board 100c which is shown in FIG. 1C.

In FIG. 2A, it is shown that, according to the embodiment which is shown here, the both electronic components 120 are firstly attached to the sandwich structure (reference signs 136, 150, 138).

As can be seen in FIG. 2B, firstly a dielectric partial layer 214b is applied on the metal foil 136 besides the electronic components 120. According to the embodiment which is shown here, the upper surface of the dielectric partial layer 214b is substantially flush with the surface of the electronic component 120. As can be further seen in FIG. 2B, the partial layer 214b does not completely reach the sidewall of the electronic component 120, such that a gap 121 results in the 2D sectional view of FIG. 2B, which in reality, i.e. in 3D, is a spacing which is surrounding the electronic component 120.

As can further be seen in FIG. 2B, according to the embodiment which is shown here, a cover structure is prepared. According to the embodiment which is shown here, this cover structure contains a further dielectric partial layer 214a which is formed at the lower side of the metallic layer 134 which is formed as metal foil.

As can be seen in FIG. 2C, the cover structure which is consisting of the metal foil 134 and the dielectric partial layer 214a is put on the basis structure from above, whose upper side is formed by the upper surface of the dielectric partial layer 214b. Subsequently, the entire layer build-up is pressed in a known manner. As a result, the both dielectric partial layers 214a and 214b unite with each other to the uniform dielectric layer 114. Due to a certain flowability of the corresponding dielectric material, during pressing also the spacings 221 are filled. Thereby, the electronic components 120 are surrounded from all sides by the dielectric material of the dielectric layer 114. Due to the above described mechanical properties of the dielectric material, the electronic components 120 are embedded in the dielectric layer 114 in an especially gentle and at the same time reliable manner.

After the procedure of pressing, in a known manner, for example by means of laser drilling, the vias 160 are formed. According to the embodiment which is shown here, these vias 160 extend both from above and also from below up to the both electronic components 120. By means of a metallization of these vias 160, the electronic components 120 can be electrically contacted later in a suitable manner.

Figure 3:
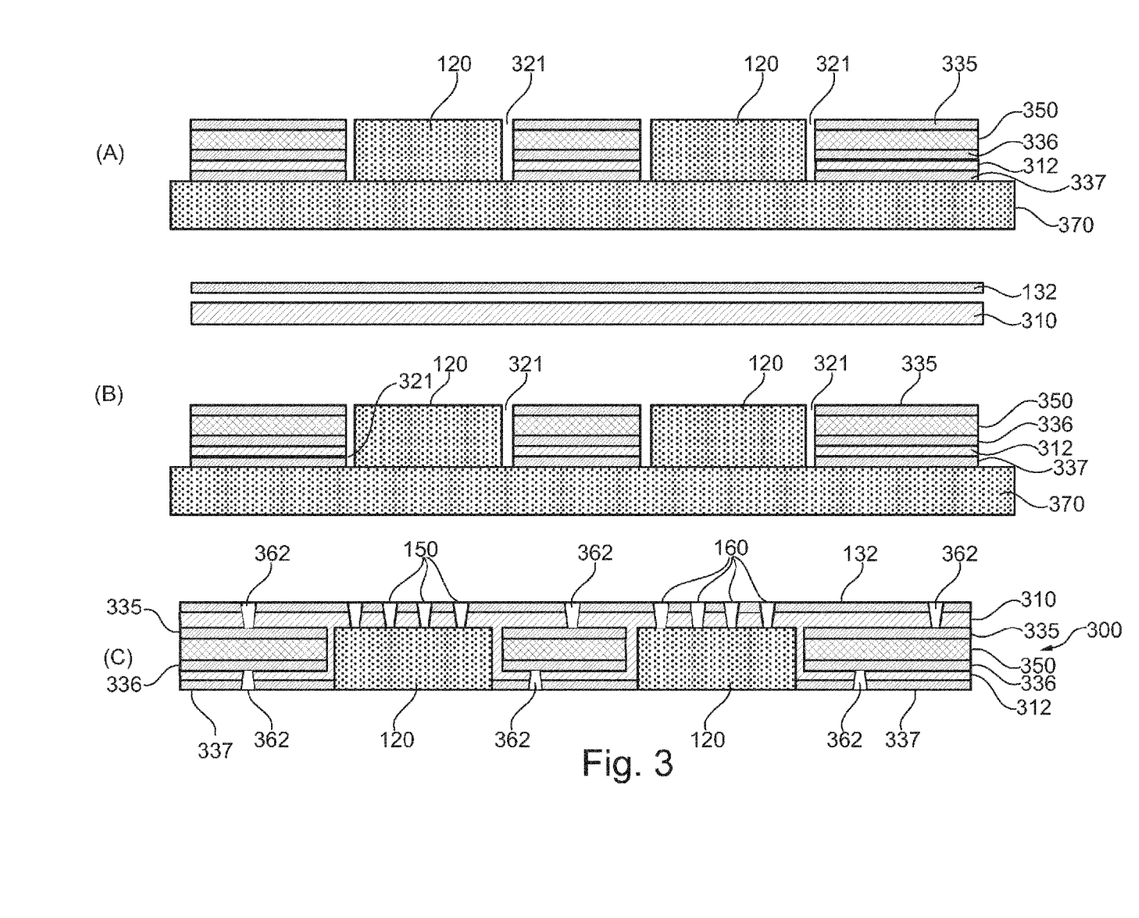
FIGS. 3A, 3B and 3C show in a cross-sectional view the manufacturing of the circuit board according to a third embodiment using a temporary carrier.

The FIGS. 3A, 3B, and 3C show in a cross-sectional view the manufacturing of a circuit board 300 using a temporary carrier 370. The circuit board 300 corresponds to a part of the circuit board 100c which is shown in FIG. 1C, before that layers are applied which are responsible for the strong asymmetry of the circuit board 100c.

As can be seen in FIG. 3A, the both embedded electronic components 120 firstly are attached on an upper side of a temporary carrier 370. According to the embodiment which is shown here, this temporary carrier 370 is an adhesive foil which is often also referred to as tape.

Further, on the temporary carrier 370 (beside the electronic components 120) a layer sequence is applied which, according to the embodiment which is shown here, is consisting of the following layers: (a) a metallic layer 337, (b) a dielectric layer 312, (c) a metallic layer 338, (d) a dielectric core-layer 350 and (e) a metallic layer 336.

According to the embodiment which is shown here, during forming the above-mentioned layer sequence, between a sidewall of the electronic component 120 and that sidewall of the layer sequence which is facing the electronic component 120, respectively a gap and a spacing 321, respectively, is let free. This gap and spacing 321, respectively, may already be let free during a successive applying of the concerned layers of the layer sequence. Alternatively, this gap and spacing 321, respectively, may be formed by a suitable removing, for example by means of an etching process, after a completed forming of a layer sequence which extends up to the sidewall of the electronic component 120.

As can be seen in FIG. 3B, further a cover structure is provided which, according to the embodiment which is shown here, contains a metal foil 134 and a further dielectric layer 310 which is formed at the bottom side of the metal foil 134.

After putting on the carrier structure, the resulting layer composite is pressed. This pressing may in particular be performed together with the temporary carrier 370. If the pressing is performed together with the temporary carrier 370, the temporary carrier is removed from the circuit board 300 after the procedure of pressing (cf. FIG. 3C).

Also in this embodiment, during pressing the spacings 321 are filled with the dielectric material which, as described above, comprises a certain creeping capability. As a result, the concerned electronic component 120 is at least to a large extent completely surrounded by the dielectric material with its advantageous properties with respect to elasticity and thermal expansion.

As can further be seen in FIG. 3C, a multiplicity of vias 160 are formed in the circuit board 300 after pressing. By these vias 160, the metallic layers 336 and 338, respectively, and the electronic components 120 can be electrically contacted (from above) in a known manner after a suitable metallization.

It should further be noted that a circuit board which corresponds to the circuit board 300 can be also realized without the dielectric core-layer 350 and instead with a further dielectric layer. Further, also layer sequences are possible in which the dielectric core layer is formed at another position.

It should further be noted that the circuit board 300 can be also used as semi-finished product for manufacturing a larger circuit board structure.

Figure 4:
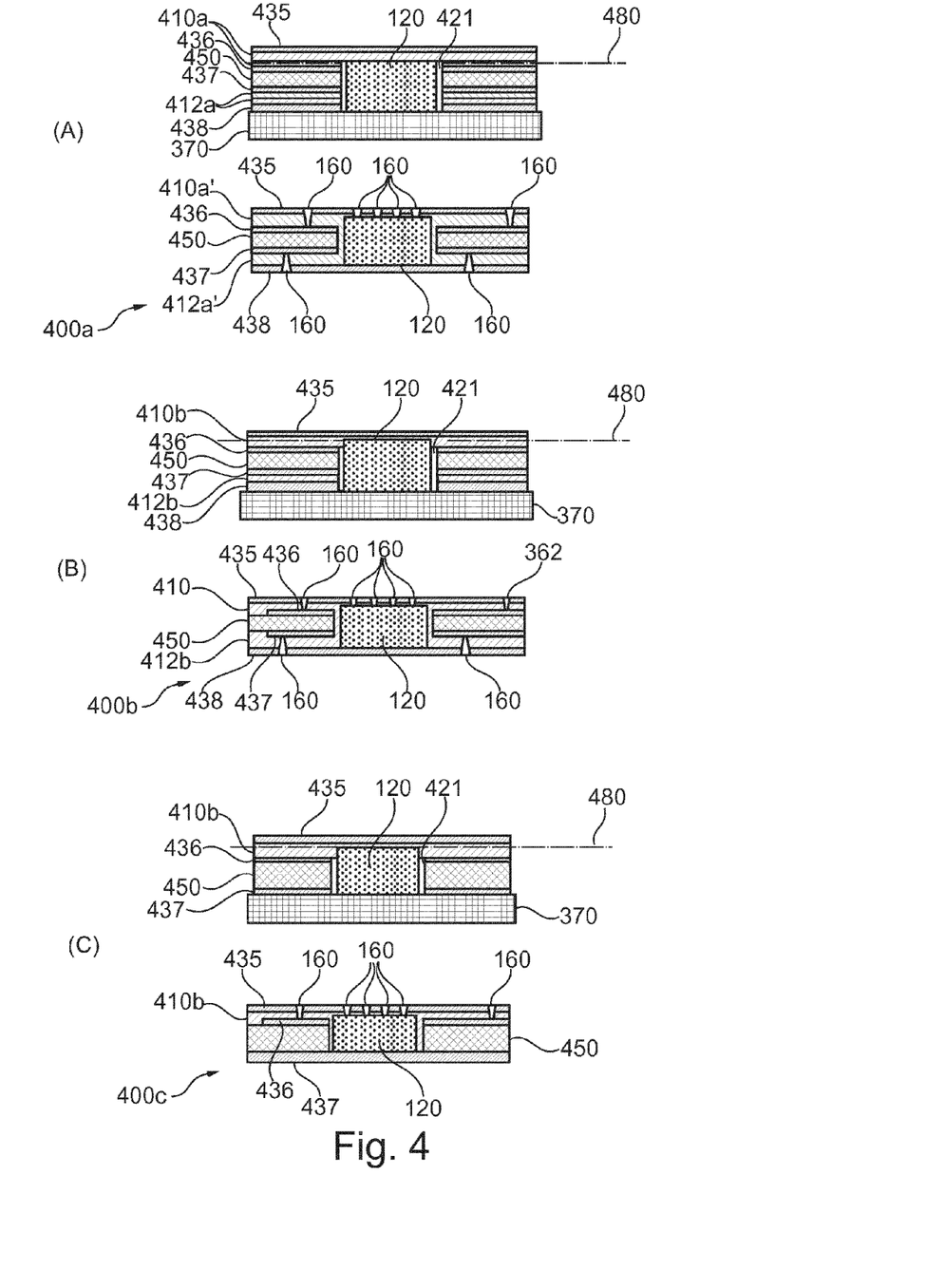
FIGS. 4A, 4B and 4C illustrate a reducing of the thickness of a circuit board which is manufactured with an embedded electronic component, when using the material described in this document.

The FIGS. 4A, 4B and 4C show different circuit boards 400a, 400b and 400c which have different thicknesses. According to the embodiments which are shown here, the circuit board 400a which is shown in FIG. 4A has a thickness of approximately 220 µm (without the temporary carrier 370). This corresponds to the thickness of known circuit boards with embedded components. The circuit board 400b has a thickness of approximately 185 µm and the circuit board 410c has a thickness of approximately 170 µm. The thinnest circuit board 400c therefore is circa 20% thinner than the circuit board 400a which, despite using the dielectric material which is described in detail in this document, is not thinner than a comparable conventional circuit board. It should be noted that in reality the thicknesses of the circuit boards are dependent on the height of the embedded component. The above mentioned thicknesses relate to an embedded component with a height of 150 µm.

In the upper illustrations of the FIGS. 4A to 4C, the layer composite of the respective circuit board 400a, 400b and 400c, respectively, is shown in an un-pressed state together with the respective temporary carrier 370. In the lower illustrations of the FIGS. 4A to 4C, the finished pressed circuit board 400a, 400b and 400c, respectively, is shown respectively without the corresponding temporary carrier.

As can be seen in FIG. 4A, a layer structure is built up above the temporary carrier 370, which, according to the embodiment which is shown here, from the bottom to the top contains the following layers: (a) a metallic layer 438, (b) two dielectric partial layers 412a, (c) a metallic layer 437, (d) a dielectric core-layer 450, (e) a metallic layer 436, (f) two dielectric partial layers 410a and (g) a metallic layer 435.

According to the embodiment which is shown here, a cavity is formed within this layer structure, in which an electronic component 120 is located. This cavity was formed during building up the layer structure subsequently to forming the lower dielectric partial layer 410a. Only after inserting the electronic component 120, the remaining layers were formed, that is the upper dielectric partial layer 410a and the metallic layer 435.

As can be seen in FIG. 4A, the width of the cavity is slightly larger than the width of the electronic component 120. However, as can be seen in the lower illustration of FIG. 4A, the respective hollow 421 is filled during pressing the layer sequence as a result of the above explained flowability of the dielectric material. Thereby, a connection results between (a) the dielectric prepreg layer 410a' which is generated by a pressure induced connecting of the both dielectric partial layers 410a and (b) the dielectric layer 412a' which is generated by a pressure induced connecting of the both dielectric partial layers 412a. Thereby, the electronic component 120 is surrounded by the inventive dielectric material at different sides, such that an especially stress-free embedding of the electronic component 120 in the circuit board 400a results.

It should be noted that the height of the cavity shown in FIG. 4A may be larger than the thickness of the electronic component 120. This has the advantage that during pressing no and only very less, respectively, pressure acts upon the electronic component 120.

For sake of completeness, it should be mentioned that suitable vias 160 can be formed in the circuit board 400a, which subsequently to a metallization which is performed in a known manner, generate electrical connections which extend in a vertical direction. As can be seen in the lower illustration of FIG. 4A, the vias 160 serve for electrical connections (a) between the electronic component 120 and the metal layer 435 and (b) between the both inner metallic layers 436 and 437 with the respectively adjacent outer metallic layer 435 and 438, respectively.

In FIG. 4B, the manufacturing of the circuit board 400b is shown which differs from the manufacturing of the circuit board 400a in that instead of the dielectric partial layers 410a and 412a, from the beginning on, a uniform dielectric layer 410b and 412b, respectively, is used. The circuit board 400b differs from the circuit board 400a further in that the electronic component 120 was already pushed into the upper dielectric layer 410b before pressing the layer composite. The difference in the height between the hollow 421 and the electronic component 120 is in a range between circa 5 µm and 15 µm. Such a pushing-in the electronic component 120 is only possible without a destruction of the component, since the material of the upper dielectric layer 410b has the excellent properties with respect to the elastic modulus E and the coefficient of thermal expansion which are described in this document. When using a conventional dielectric (prepreg-) material, such a pushing-in would lead to a destruction of the electronic component 120. In this context it is process-technically also important that the used dielectric material comprises the deformability which is described in this document also at temperatures of below 100° C. and in particular even still at room temperature. The dielectric material entering into the hollow 421 within the cavity in which the electronic component 120 is located can also be seen in FIG. 4B.

In FIG. 4C, the manufacturing of a circuit board 400c is shown which differs from the manufacturing of the circuit board 400b in that the lower dielectric layer 412b and the upper metallic layer 438 are not used. It should be noted that omitting the metallic layer 438 and in particular omitting the dielectric layer 412b is only possible, since the dielectric material of the remaining dielectric layer 410b comprises the excellent properties with respect to its elasticity, flowability and with respect to its thermal expansion which have been described in this document. Furthermore, in the circuit board 400c, the cavity for the electronic component 120 is formed in a structured core which is consisting of the layers 437, 450 and 436. As can be seen in the upper illustration of FIG. 4C, the electronic component 120 is higher than the core and the cavity, respectively. During pressing, the dielectric layer 410b provides the material which enters into the hollow 421 and which surrounds the electronic component 120 in a mechanically gentle manner.

The reduction of the build-up dimension is illustrated in the FIGS. 4A to 4C by a "dash-dot-line" 480 which specifies the upper side of the electronic component 120. By means of this "dash-dot-line" 480, the height of the layer build-up above the electronic component 120 can be distinctly recognized. In this context it should be noted again that the reducing of the thickness of a circuit board 400c which is manufactured with an embedded electronic component 120, which is illustrated in the FIGS. 4A to 4C, in praxis is only possible with the dielectric material which is described in this document, since other dielectric materials would lead to circuit boards which would in no way fulfill the quality requirements which are very high today, in particular with respect to its mechanical and thermal stability.

FIGS. 5A, 5B and 5C illustrate the separating of a symmetric circuit board structure 505 in two asymmetric circuit boards 500a and 500b. As can be seen in FIG. 5A, according to the embodiment which is described here, the substantially symmetric circuit board structure 505 from the top to the bottom comprises the following layer build-up:

a metallic layer 530
a dielectric layer 510
a metallic layer 532
a dielectric core-layer 550
a metallic layer 534
a dielectric layer 512 and a release layer 590 which respectively form a common layer in different planar subregions within an xy-plane which is perpendicular with respect to the z-axis, in the shown layer composite
a metallic layer 536
a dielectric core-layer 552
a metallic layer 538
a dielectric layer 514
a metallic layer 539

At this point it should be noted that for the here described symmetric manufacturing method, all asymmetric build-ups which are described above by means of the FIGS. 1 to 4 can be used.

As can be seen in FIG. 5A, above the release layer 590, two electronic components 520a and 520b are embedded. The respective electronic component 520a, 520b is entirely embedded in the dielectric layer 510 with its advantageous mechanical and thermal properties from above and from the side. At the bottom side of the both electronic components 520a and 520b, the release layer 590 is abutting.

In a respective manner, below the release layer 590 two electronic components 520c and 520d are embedded. These are entirely surrounded by the dielectric layer 514 at their bottom side and at their lateral surfaces. At the top side of the both electronic components 520c and 520d, the release layer 590 is abutting.

Furthermore, as can be seen in FIG. 5A, a multiplicity of vias 560 is formed for respectively a suitable electrical contacting.

The FIGS. 5B and 5C show the two asymmetric circuit boards 500a and 500b which result by a separating of the layer composite 505 at the release layer and at the subregions of the dielectric layer 512 which are comparably small with respect to the area. The parts of the release layer which result after the separating are denoted with the reference signs 590a and 590b, respectively, in the FIGS. 5B and 5C.

Figure 5:
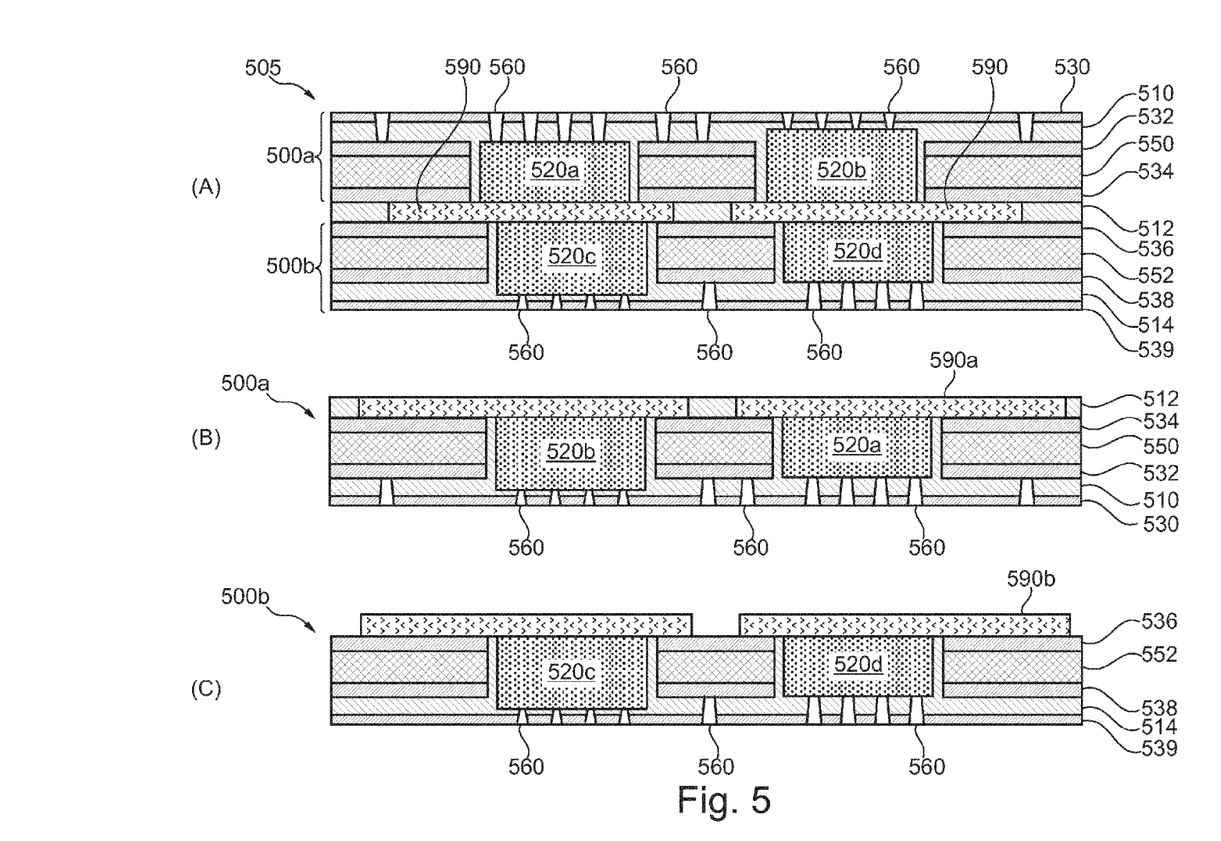
FIGS. 5A, 5B and 5C illustrate the manufacturing of a symmetric circuit board structure with two semi-finished products which respectively are an asymmetric circuit board.

The advantage of the here described manufacturing of two asymmetric circuit boards 500a and 500b is consisting in that many processing steps which are not shown in FIG. 5 can be performed at the substantially symmetric layer build-up 505.

Finally, it should be noted that in all embodiments described above, the respective circuit board may be built up without an embedded component 120. This means that the respective circuit board is used as component carrier at which only at the planar surface and/or at the planar bottom side electronic components may be attached and assembled, respectively.

REFERENCE SIGNS 100 circuit board with embedded electronic components
110 dielectric layer
110a,b,c dielectric partial layer
120 electronic component
121 gap/spacing
130 metallic layer/metal foil
132 metallic layer/metal foil
160 vias
200 circuit board with embedded electronic components
210 dielectric layer
210b dielectric partial layer
250 dielectric core-layer
234 metallic layer/metal foil
300 circuit board with embedded electronic components
310 dielectric layer
312 dielectric layer
321 gap/spacing
335 metallic layer
336 metallic layer
337 metallic layer
350 dielectric core-layer
362 vias
370 temporary carrier/tape
400a,b,c circuit board with embedded electronic component
410a dielectric partial layers
410a' united dielectric layer
410b dielectric layer
412a dielectric partial layers
412a' united dielectric layer
412b dielectric layer
421 hollow
435 metallic layer
436 metallic layer
437 metallic layer
438 metallic layer
450 dielectric core-layer
480 dash-dot-line
500a circuit board (asymmetric)
500b circuit board (asymmetric)
505 circuit board structure (symmetric layer build-up)
510 dielectric layer
512 dielectric layer
514 dielectric layer
530 metallic layer
532 metallic layer
534 metallic layer
536 metallic layer
538 metallic layer
539 metallic layer
550 dielectric core-layer
552 dielectric core-layer
560 vias
590 release layer
590a/b portion of release layer

The invention claimed is:

1. A circuit board comprising; a layer composite with at least one dielectric layer which comprises a planar extension in parallel with respect to an xy-plane which is spanned by an x-axis and a y-axis which is perpendicular thereto, and comprises a layer thickness along a z-axis which is perpendicular with respect to the x-axis and to the y-axis; and at least one metallic layer which is attached to the dielectric layer in a planar manner; wherein the layer composite along the z-axis is free from a symmetry plane which is oriented in parallel with respect to the xy-plane, and the dielectric layer comprises a dielectric material which has an elastic modulus E in a range between 1 and 20 GPa and along the x-axis and along the y-axis a coefficient of thermal expansion in a range between 0 and 17 ppm/K, wherein the dielectric material is a blend or a copolymer, consisting of at least one first material with a first elastic modulus E and a first coefficient of thermal expansion and a second material with a second elastic modulus E and a second coefficient of thermal expansion, wherein the first elastic modulus is larger than the second elastic modulus and the first coefficient of thermal expansion is smaller than the second coefficient of thermal expansion, wherein the first material comprises a resin and a hard filler which is located therein, and wherein the second material is a thermally curable resin which is connected to a softening substance.

2. The circuit board of claim 1, wherein the dielectric material comprises a creeping property which is determined by at least one of the following properties: (a) a plastic deformability in a range between 0.01% and 10%, (b) a viscoelastic deformability in a range between 0% and 10%.

3. The circuit board of claim 1, wherein the first material comprises a first glass transition temperature and the second material comprises a second glass transition temperature.

4. The circuit board of claim 1, further comprising at least one of the following features: wherein the value for the elastic modulus E is in a range between 2 and 7 GPa; and/or wherein the coefficient of thermal expansion is in a range between 3 and 10; and/or wherein the layer composite comprises an asymmetry with respect to the number of the layers along the z-axis, and/or wherein the layer composite comprises an asymmetry with respect to the thicknesses of the single layers along the z-axis; and/or wherein the layer composite comprises an asymmetry with respect to the materials of the single layers along the z-axis.

5. The circuit board of claim 1, further comprising; a component which is embedded in the dielectric layer and/or in a dielectric core-layer of the circuit board.

6. The circuit board of claim 1, wherein the component is embedded in the dielectric layer.

7. The circuit board of claim 1, further comprising; the dielectric core-layer which is attached to the metallic layer and/or to the dielectric layer in a planar manner, wherein the component is embedded in the dielectric core-layer and the dielectric layer is arranged above or below the dielectric core-layer and the embedded electronic component.

8. The circuit board of claim 7, further comprising at least one of the following features: wherein the component is adhered within the dielectric core-layer; and/or wherein the dielectric core-layer comprises a dielectric core material which has a coefficient of thermal expansion from 0 to 11 ppm/k.

9. The circuit board of claim 5, wherein the entire thickness of the layer composite is smaller than approximately 200 μm.

10. The circuit board of claim 1, wherein the dielectric layer is a dielectric prepreg-layer and/or the dielectric material is a dielectric prepreg-material.

11. A method of manufacturing a circuit board, the method comprising: building up a superordinated layer composite with at least one dielectric layer which comprises a planar extension in parallel with respect to an xy-plane which is spanned by an x-axis and a y-axis which is perpendicular thereto, and having a layer thickness along a z-axis which is perpendicular with respect to the x-axis and to the y-axis; and at least one metallic layer which is attached to the dielectric layer in a planar manner; wherein the layer composite along the z-axis is free from a symmetry plane which is oriented in parallel with respect to the xy-plane, and the dielectric layer comprises a dielectric material which has an elastic modulus E in a range between 1 and 20 GPa and along the x-axis and along the y-axis a coefficient of thermal expansion in a range between 0 and 17 ppm/K, wherein the dielectric material is a blend or a copolymer, consisting of at least one first material with a first elastic modulus E and a first coefficient of thermal expansion and a second material with a second elastic modulus E and a second coefficient of thermal expansion, wherein the first elastic modulus is larger than the second elastic modulus and the first coefficient of thermal expansion is smaller than the second coefficient of thermal expansion, wherein the first material comprises a resin and a hard filler which is located therein, and wherein the second material is a thermally curable resin which is connected to a softening substance.

12. The method of claim 11, further comprising; forming a recess in the dielectric layer and/or in a dielectric core-layer; and inserting an electronic component into the recess.

13. The method of claim 12, wherein the recess is larger than the electronic component, such that after an inserting of the electronic component into the recess, a hollow remains.

14. The method of claim 12, further comprising: if the electronic component is inserted in the dielectric layer, applying a further dielectric layer on the dielectric layer and the electronic cornponent, wherein the further dielectric layer has the same properties as the dielectric layer; and if the electronic component is embedded in the dielectric core-layer, applying the dielectric layer on the dielectric core-layer and the electronic component.

15. The method of claim 11, further comprising at least one of the following features: forming a metallic layer at the dielectric layer, and/or pressing all layers of the circuit board.

16. A method of manufacturing two processed circuit boards, the method, comprising;
building up a layer composite comprising a first circuit board and a second circuit board, and a release layer which is arranged between the first circuit board and the second circuit board,
the first circuit board and the second circuit board having a layer composite with at least one dielectric layer which comprises a planar extension in parallel with respect to an xy-plane which is spanned by an x-axis and a y-axis which is perpendicular thereto, and comprises a layer thickness along a z-axis which is perpendicular with respect to the x-axis and to the y-axis; and
at least one metallic layer which is attached to the dielectric layer in a planar manner; wherein the layer composite along the z-axis is free from a symmetry plane which is oriented in parallel with respect to the xy-plane, and the dielectric layer comprises a dielectric material which has an elastic modulus E in a range between 1 and 20 GPa and along the x-axis and along the y-axis a coefficient of thermal expansion in a range between 0 and 17 ppm/K,
wherein the dielectric material is a blend or a copolymer, consisting of at least one first material with a first elastic modulus E and a first coefficient of thermal expansion and a second material with a second elastic modulus E and a second coefficient of thermal expansion,
wherein the first elastic modulus is larger than the second elastic modulus and the first coefficient of thermal expansion is smaller than the second coefficient of thermal expansion, wherein the first material comprises a resin and a hard filler which is located therein, and
wherein the second material is a thermally curable resin which is connected to a softening substance;

processing the layer composite; and separating the layer composite at the release layer, such that a first processed circuit board and a second processed circuit board with respectively one asymmetric layer build-up are generated.

17. The method of claim 16 comprising at least one of the following features: wherein the built up layer composite comprises a symmetry plane along the z-axis, which is oriented in parallel with respect to the xy-plane, and/or wherein the release layer comprises a printable adhesion reducing material, and wherein the method further comprises printing the adhesion reducing material on at least a subregion of the first circuit board or on at least a subregion of the second circuit board.

* * * * *